United States Patent
Lee

(10) Patent No.: US 8,765,274 B2
(45) Date of Patent: Jul. 1, 2014

(54) SECONDARY BATTERY AND METHOD OF MAKING SECONDARY BATTERY

(75) Inventor: Woojin Lee, Suwon-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 788 days.

(21) Appl. No.: 12/887,760

(22) Filed: Sep. 22, 2010

(65) Prior Publication Data

US 2011/0123839 A1  May 26, 2011

(30) Foreign Application Priority Data

Nov. 24, 2009  (KR) .................. 10-2009-0113893

(51) Int. Cl.
  *H01M 10/42*  (2006.01)
  *H01M 10/46*  (2006.01)
  *H01R 12/00*  (2006.01)
  *H05K 1/00*  (2006.01)
  *H05K 3/00*  (2006.01)

(52) U.S. Cl.
  USPC .................. 429/7; 29/846; 174/250

(58) Field of Classification Search
  USPC ............... 429/50–52, 61–64, 90–93, 96–100, 429/163–187, 208, 122, 162, 7; 29/623.1–623.5, 846, 745–746; 221/282; 174/257, 255
  See application file for complete search history.

(56) References Cited

U.S. PATENT DOCUMENTS

| | | | |
|---|---|---|---|
| 6,344,308 | B1 | 2/2002 | Kurita et al. |
| 7,329,473 | B2 | 2/2008 | Shen et al. |
| 2005/0150683 | A1* | 7/2005 | Farnworth et al. ............ 174/255 |
| 2006/0127756 | A1* | 6/2006 | Seo ................................ 429/175 |
| 2006/0263647 | A1 | 11/2006 | Moon et al. |
| 2008/0296051 | A1 | 12/2008 | Yamaguchi |

FOREIGN PATENT DOCUMENTS

| | | |
|---|---|---|
| JP | 2007317899 | 12/2007 |
| JP | 2008-294351 | 12/2008 |
| JP | 2008294290 | 12/2008 |
| KR | 2003-0046825 A | 6/2003 |
| KR | 1020060040236 A | 5/2006 |

OTHER PUBLICATIONS

Korean Notice of Allowance issued by KIPO on Dec. 19, 2011, corresponding to Korean Patent Application No. 10-2009-0113893 and Request for Entry attached herewith.
Korean Office Action issued by KIPO, dated Apr. 4, 2011, corresponding to Korean Patent Application No. 10-2009-0113893, together with Request for Entry.

* cited by examiner

*Primary Examiner* — Basia Ridley
*Assistant Examiner* — Caitlin Wilmot
(74) *Attorney, Agent, or Firm* — Robert E. Bushnell, Esq.

(57) ABSTRACT

A secondary battery and a method for making the secondary battery, which are capable of preventing separation between a metal plating layer and a flexible printed circuit board, and improving adhering force between a battery pack and the flexible printed circuit board, through a structure of a metal plating layer and protective layer of the flexible printed circuit board. The secondary battery includes an insulation layer with a first and second surface, a first line pattern layer formed on the first surface of the insulation layer, a first protective layer formed on the insulation layer and the first line pattern layer to define a first opening that exposes a portion of the first line pattern layer, and a first metal plating layer formed in the first opening. The first protective layer contacts the first line pattern layer and a side surface of the first metal plating layer.

18 Claims, 11 Drawing Sheets

SECONDARY BATTERY AND METHOD OF MAKING SECONDARY BATTERY

CLAIM OR PRIORITY

This application makes reference to, incorporates into this specification the entire contents of, and claims all benefits accruing under 35 U.S.C. §119 from an application earlier filed in the Korean Intellectual Property Office filed on Nov. 24, 2009, and there duly assigned Serial No. 10-2009-0113893.

BACKGROUND OF THE INVENTION

1. Field of the Invention

Embodiments relate to a secondary battery and a method of making the secondary battery.

2. Description of the Related Art

Secondary batteries are made in various configurations including pouch and prismatic type configurations. The above information disclosed in this Related Art section is only for enhancement of understanding of the background of the invention and therefore it may contain information that does not form the prior art that is already known to a person of ordinary skill in the art.

SUMMARY OF THE INVENTION

Embodiments are directed to a secondary battery and a method of making the secondary battery, which substantially overcome one or more of the problems due to the limitations and disadvantages of the related art.

It is therefore an aspect of an embodiment to provide a secondary battery and a method of making the secondary battery, which are capable of preventing separation between a metal plating layer and a flexible printed circuit board, and improving adhering force between a battery pack and the flexible printed circuit board, through an improved structure of a metal plating layer and protective layer of the flexible printed circuit board.

At least one of the above and other aspects and advantages may be realized by providing a secondary battery including: an insulation layer providing a first surface and a second surface; a first line pattern layer formed on the first surface of the insulation layer; a first protective layer formed on the insulation layer and the first line pattern layer, and defining a first opening that exposes a portion of the first line pattern layer; and a first metal plating layer formed in the first opening, wherein the first protective layer contacts the first line pattern layer and a side surface of the first metal plating layer.

Here, the first opening may have a width that is less than a width of the first line pattern layer, and the first metal plating layer may have a width that is the same as a width of the first opening.

Also, the secondary battery may further include a second protective layer formed on the second surface of the insulation layer, or a second line pattern layer formed on the second surface of the insulation layer, and a second protective layer defining a second opening that exposes a portion of the second line pattern layer.

Further, the second opening may have a second metal plating layer formed therein, and the first metal plating layer and the second metal plating layer may have surfaces that are coplanar to surfaces of the first line pattern layer and the second line pattern layer, respectively.

At least one of the above and other aspects and advantages may be realized by providing a secondary battery including: an insulation layer providing a first surface and a second surface; a first and a second line pattern layer formed on the first and second surfaces, respectively, of the insulation layer; a first protective layer formed on the insulation layer and the first line pattern layer, and defining a first opening that exposes a portion of the first line pattern layer; a second protective layer formed on the insulation layer and the second line pattern layer, and defining a second opening that exposes a portion of the second line pattern layer; a first metal plating layer and a second metal plating layer formed in the first opening and the second opening, respectively; and a hole defined through the insulation layer, the first and second line pattern layers, and the first and second metal plating layers, wherein the first protective layer contacts the first metal plating layer and a side surface of the first line pattern layer, and the second protective layer contacts the second metal plating layer and a side surface of the second line pattern layer.

Here, the first opening and the second opening may have widths that are less than widths of the first line pattern layer and the second line pattern layer, respectively.

Also, the first metal plating layer and the second metal plating layer may have widths that are equal to widths of the first opening and the second opening, respectively.

Further, the secondary battery may further include a line pattern connecting region formed on an inner wall of the hole along the insulation layer, and a metal plating layer connecting region formed on an inner wall of the hole along the line pattern connecting region.

In addition, the first metal plating layer may have a surface that is coplanar to a surface of the first line pattern layer, and the second line pattern layer may have a surface that is coplanar to a surface of the second line pattern layer.

At least one of the above and other aspects and advantages may be realized by providing a method for making a secondary battery, the method including the steps of: preparing an insulation layer with a copper thin film formed on a first surface and a second surface thereof; forming a copper thin film pattern on the first and second surface of the insulation layer; forming a first line pattern layer and a second line pattern layer through metal plating the copper thin film pattern; defining a first opening and a second opening in the insulation layer and in the first line pattern layer and the second line pattern layer, respectively, to expose a portion of the first line pattern layer and the second line pattern layer, respectively; forming a first and second metal plating layer through metal plating the first line pattern layer and the second line pattern layer; and contacting the first protective layer with the first metal plating layer and a side surface of the first line pattern layer, and contacting the second protective layer with the second metal plating layer and a side surface of the second line pattern layer.

Here, in the forming of the line pattern layers, widths of the first and second line pattern layers may be made greater than widths of the first and second openings, respectively.

Also, in the forming of the metal plating layers, widths of the first and second metal plating layers may be made the same as widths of the first and second openings, respectively.

At least one of the above and other aspects and advantages may be realized by providing a method for making a secondary battery, the method including the steps of: preparing an insulation layer with a copper thin film formed on a first surface and a second surface thereof; forming a first and second copper thin film pattern on the first and second surface, respectively, of the insulation layer; defining a hole through the insulation layer and the copper thin film patterns; forming a first line pattern layer and a second line pattern layer through metal plating the copper thin film patterns;

defining a first opening and a second opening in the insulation layer and in the first line pattern layer and the second line pattern layer, respectively, to expose a portion of the first line pattern layer and the second line pattern layer, respectively; forming a first and second metal plating layer through metal plating the first line pattern layer and the second line pattern layer; and contacting the first protective layer with the first metal plating layer and a side surface of the first line pattern layer, and contacting the second protective layer with the second metal plating layer and a side surface of the second line pattern layer.

Here, the forming of the line pattern layers may include forming a line pattern connecting region along an inner wall of the hole.

Also, the metal plating of the line pattern layers may include forming a metal plating layer connecting region along a line pattern connecting region.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
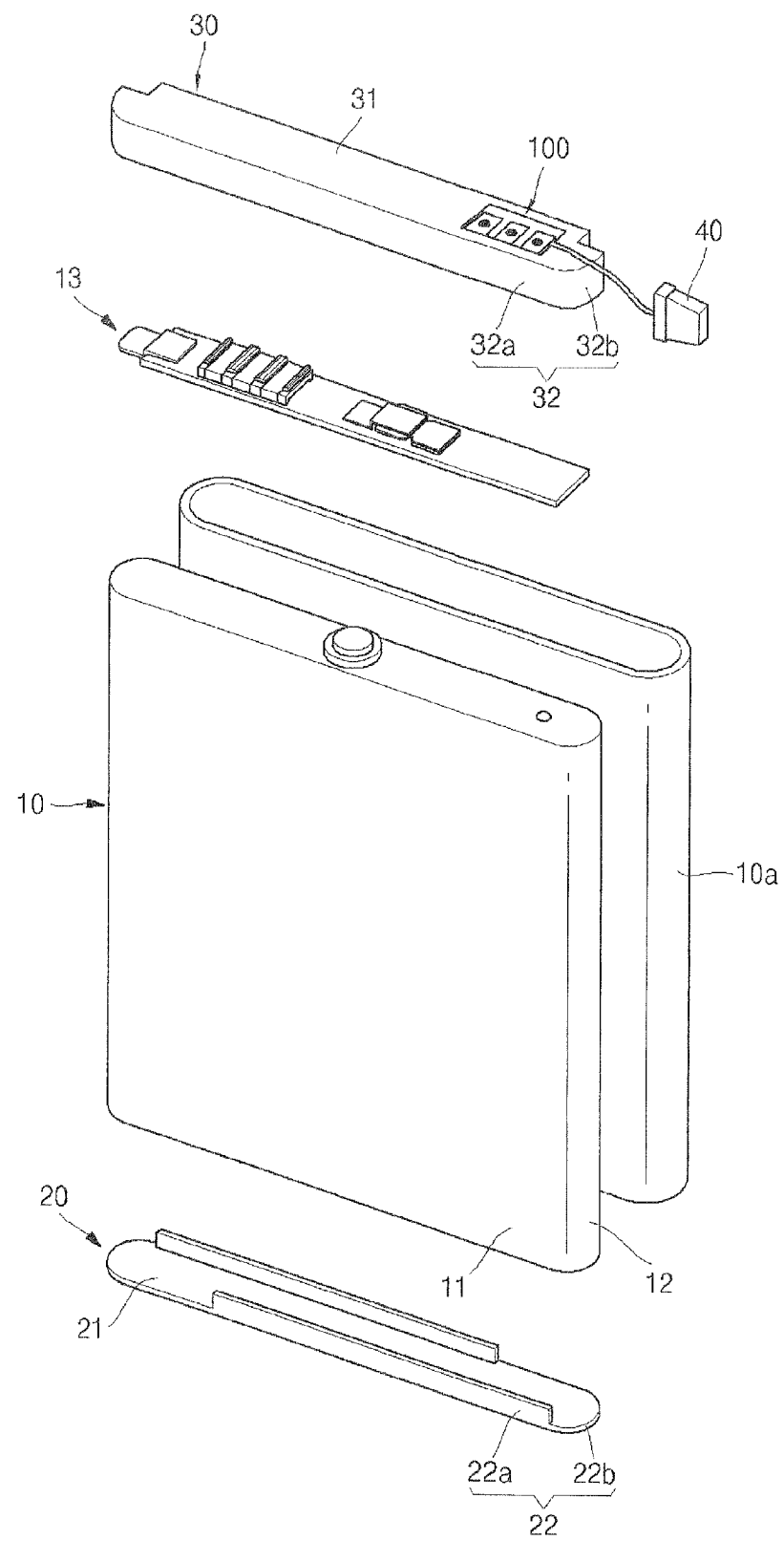
FIG. 1A illustrates a perspective diagram of a battery pack on which a flexible printed circuit board is mounted according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

A conventional secondary battery may be formed with a band having an insulating separator interposed between a positive electrode plate and negative electrode plate, which is wound into a spiral electrode array, or a positive electrode plate, negative electrode plate, and separator stacked in plurality to form an electrode array, after which the electrode array is installed inside a case, a cap assembly formed with an external terminal is formed on the case, and an FPCB (Flexible Printed Circuit Board) is installed on the external terminal to electrically connect to an external device.

In such a conventional secondary battery the flexible printed circuit board is constituted with an insulation layer, a line pattern layer, a protective layer, a metal plating layer, etc., and solder is applied to electrically connect the external terminal to the flexible printed circuit board.

FIG. 1A illustrates a perspective diagram of a battery pack on which a flexible printed circuit board is mounted according to an embodiment.

Referring to FIG. 1A, a battery pack 1 according to an embodiment may include a bare cell 10, a bottom cover 20, and a top cover 30. A PCM (Protective Circuit Module) 13 may be disposed on the bare cell 10 and electrically and mechanically connected thereto. The external surface of the bare cell 10 may be enclosed and protected by a label 10a.

The bare cell 10 may be constituted of a large side surface 11 with a comparatively large surface area, and a small side surface 12 with a comparatively small surface area. Here, the label 10a may be formed to enclose the bare cell 10, and may employ an adhesive to cover the side surfaces of the bare cell 10.

The bare cell 10 may be a can type or pouch type secondary cell, but is not limited to any particular type of battery cell in embodiments. Also, because the bare cell is one that is typically used in a secondary battery, a description of the structure of the bare cell will not be provided.

The bottom cover 20 is coupled to the bottom of the battery cell. The bottom cover 20 may be constituted of a floor plate 21, and a sidewall 22 extending toward the label 10a from the floor plate 21.

The floor plate 21 may be formed in approximately the same shape as the undersurface of the bare cell 10, and may be attached to the undersurface of the battery cell with an adhesive.

The sidewall 22 includes first sidewalls 22a disposed at both lengthwise ends on the bottom cover 20, and second sidewalls 22b connecting the first sidewalls 22a. The first sidewalls 22a contact a region corresponding to the large side surface 11 of the bare cell 10. The second sidewalls 22b contact a region corresponding to the small side surface 12. In order to protect the bare cell 10, the bottom cover 20 is capable of blocking entry of foreign substances from the outside and absorbs external shocks.

The top cover 30 may be coupled to the top of the bare cell 10, and may enclose the FPCB 100. The FPCB has a connector 40 for electrically connecting to an external device (not shown)

The top cover 30 may include a cover plate 31, and a sidewall 32 extending from the cover plate 31 toward the label 10. The sidewall 32 may include a large sidewall 32a and a small sidewall 32b. The large sidewall 32a corresponds to the large side surface 11 of the bare cell 10. The small sidewall 32b corresponds to the small side surface 12 of the bare cell 10.

The cover plate 31 may be formed in approximately the same shape as the top surface of the bare cell 10.

Figure 1B:
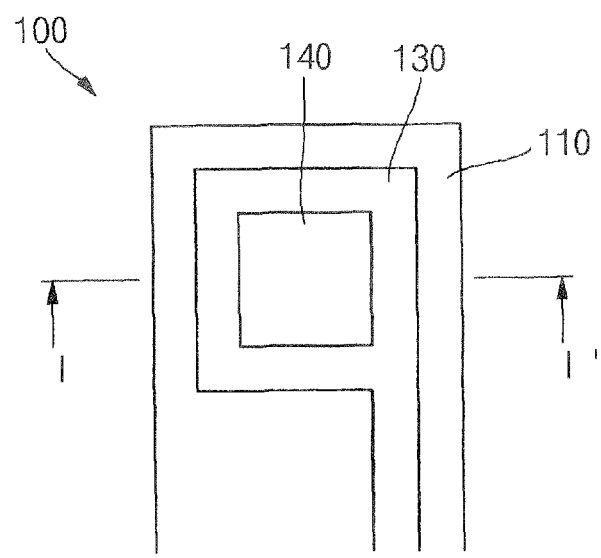
FIGS. 1B and 1C illustrate sectional diagrams of flexible printed circuit boards according to embodiments.
Figure 1C:
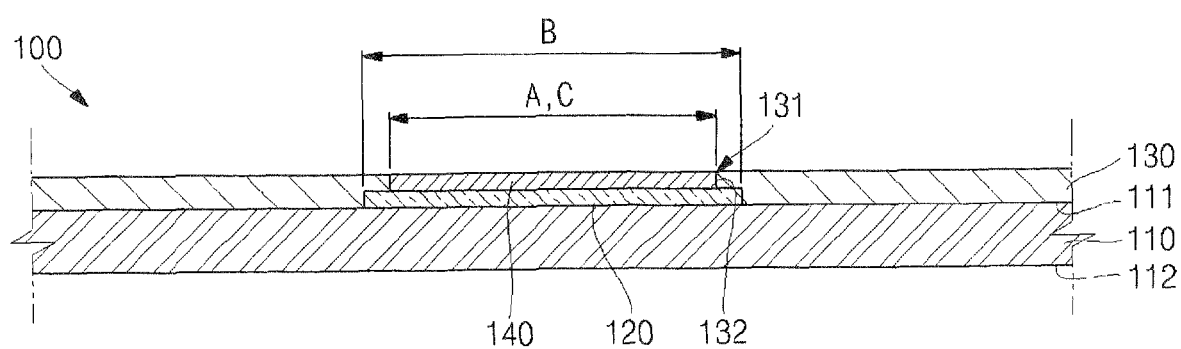

FIGS. 1B and 1C illustrate an enlarged undersurface diagram of the flexible printed circuit board 100 mounted to the top cover 30 in FIG. 1A, and a sectional diagram of the flexible printed circuit board 100 taken along direction I-I'.

Referring to FIGS. 1B and 1C, the flexible printed circuit board 100 may include an insulation layer 110, a first line pattern layer 120, a first protective layer 130, and a first metal plating layer 140.

The insulation layer 110 is formed in a plate shape provided with a first surface 111 and a second surface 112. The insulation layer 110 may employ a polyester or polyamide film commonly used for printed circuit boards.

The first line pattern layer 120 is formed on the first surface 111 of the insulation layer 110. That is, the first line pattern layer 120 is disposed at the top of the insulation layer 110, with at least one arranged horizontally. Here, the first line pattern layer 120 is formed in the shape of a plate. The first line pattern layer 120 may be formed of copper (Cu), titanium (Ti), nickel (Ni), palladium (Pd), etc., and in an embodiment, the first line pattern layer 120 is formed by metal plating copper. The first line pattern layer 120 electrically connects the first metal plating layer 140. The first line pattern layer 120 is formed between the insulation layer 110 and the first metal plating layer 140.

The first protective layer 130 is formed on the insulation layer 110 and the first line pattern layer 120, and defines a first opening 131 to expose a portion of the first line pattern layer 120. Specifically, the first protective layer 130 is formed at a certain thickness on the outer perimeter of the first line pattern layer 120. Here, the width A of the first opening 131 is made smaller than the width B of the first line pattern layer 120. Accordingly, the side surface 132 of the first protective layer 130 contacts the first line pattern layer 120. Also, a portion of the first line pattern layer 120 may be exposed in a rectangular shape.

The first protective layer 130 protects the first line pattern layer 120 from the external environment. It also prevents the position of the first metal plating layer 140 from being changed when forming the first metal plating layer 140 on top of the first line pattern layer 120. While the first protective layer 130 may be one selected from polyimide, epoxy, BCB (Benzo Cyclo Butene), PBO (Poly Benz Oxazole), and equivalents thereof, its material is not limited thereto.

The first metal plating layer 140 is formed in the first opening 131 of the first protective layer 130. The width C of the first metal plating layer 140 is also formed smaller than the width B of the first line pattern layer 120. Thus, the side surface of the first metal plating layer 140 contacts the side surface 132 of the first protective layer 130. Here, the surface of the first metal plating layer 140 is formed coplanar. That is, the surfaces of the first metal plating layer 140 and the first protective layer 130 are flat along the same straight line. The first metal plating layer 140 with such a configuration contacts the first line pattern layer 120 and the first protective layer 130.

Accordingly, when the flexible printed circuit board 100 flexes, the metal plating layer may be prevented from separating from the line pattern layer and the protective layer.

Next, a description of a flexible printed circuit board according to an embodiment will be provided.

Figure 2:
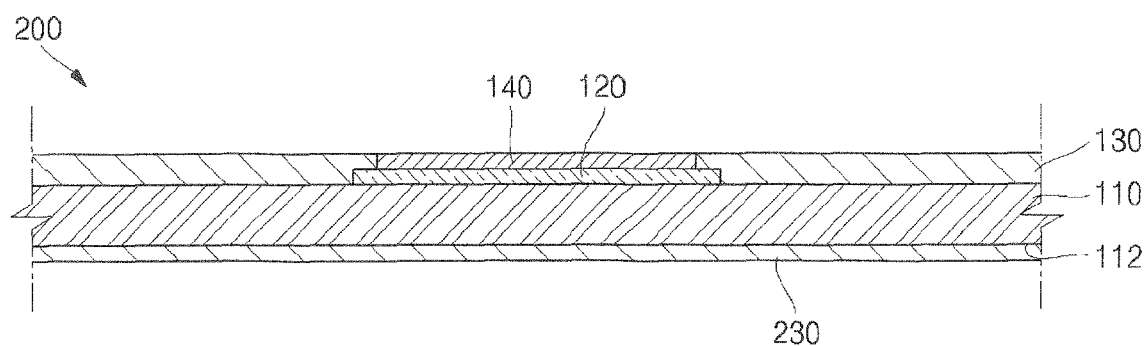
FIG. 2 illustrates a sectional diagram of a flexible printed circuit board according to an embodiment.

FIG. 2 illustrates a sectional diagram of a flexible printed circuit board 200 according to an embodiment.

Referring to FIG. 2, the flexible printed circuit board 200 may include an insulation layer 110, a first line pattern layer 120, a first protective layer 130, a first metal plating layer 140, and a second protective layer 230.

Here, the insulation layer 110, the first line pattern layer 120, the first protective layer 130, and the first metal plating layer 140 have the same structure as illustrated in FIG. 1C. Therefore, only differences thereof will be described.

Referring to FIG. 2, a second protective layer 230 may be further formed on the second surface 112 of the insulation layer 110. The second protective layer 230 is formed in a plate shape that contacts the second surface 112 that is the bottom of the insulation layer 110 and runs parallel with the insulation layer 110. The second protective layer 230 protects the insulation layer 110 from the external environment. While the second protective layer 230 may be one selected from polyimide, epoxy, BCB (Benzo Cyclo Butene), PBO (Poly Benz Oxazole), and equivalents thereof, its material is not limited thereto.

Figure 3:
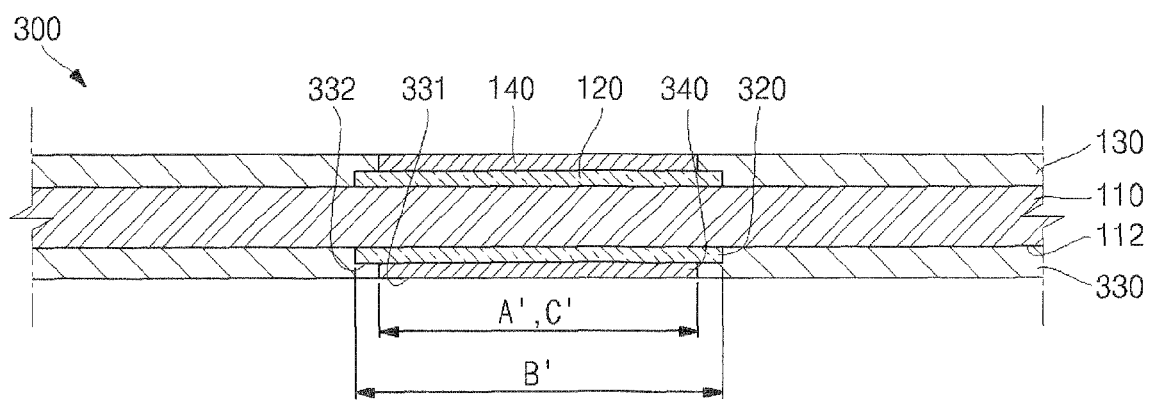
FIG. 3 illustrates a sectional diagram of a flexible printed circuit board according to an embodiment.

FIG. 3 illustrates a sectional diagram of a flexible printed circuit board 300 according to an embodiment.

Referring to FIG. 3, the flexible printed circuit board 300 may include an insulation layer 110, a first line pattern layer 120, a second line pattern layer 320, a first protective layer 130, a second protective layer 330, a first metal plating layer 140, and a second metal plating layer 340.

Here, the insulation layer 110, the first line pattern layer 120, the first protective layer 130, and the first metal plating layer 140 have the same structure as illustrated in FIG. 1C. Therefore, only differences thereof will be described.

The insulation layer 110 may have the second line pattern layer 320 further formed on its second surface 112, and may further have the second protective layer 330 formed thereon, which defines a second opening 331 that exposes a portion of the second line pattern layer 320.

The second line pattern layer 320 is formed on the second surface 112 of the insulation layer 110. Specifically, the second line pattern layer 320 is formed at the bottom of the insulation layer 110, where at least one is horizontally arranged. Here, the second line pattern layer 320 is formed in a plate shape. The second line pattern layer 320 may be formed of the same material as the first line pattern layer 120. The second line pattern layer 320 electrically connects the second metal plating layer 340. The second line pattern layer 320 is formed between the insulation layer 110 and the second metal plating layer 340.

The second protective layer 330 is formed on the insulation layer 110 and the second line pattern layer 320, and the second opening 331 is defined to expose a portion of the second line pattern layer 320. Specifically, the second protective layer 330 is formed of a certain thickness on the outer periphery of the second line pattern layer 320 of the insulation layer 110. Here, the width A' of the second opening 331 is less than the width B' of the second line pattern layer 320. Accordingly, a cut surface 332 of the second protective layer 330 covers a bottom portion of the second line pattern layer 320.

The second protective layer 330 protects the second line pattern layer 320 from the external environment, and also prevents the position of the second metal plating layer 340 formed at the bottom of the second line pattern layer 320 from being changed. The second protective layer 330 may be formed of the same material as the first protective layer 130. The second protective layer 330 contacts the bottom of the insulation layer 110 and a portion of the second line pattern layer 320.

The second metal plating layer 340 is formed in the second opening 331 of the second protective layer 330. The width C' of the second metal plating layer 340 is the same as the width A' of the second opening 331, and is formed across the bottom of the second line pattern layer 320. Also, the width C' of the second metal plating layer 340 is less than the width B' of the second line pattern layer 320. Therefore, the second metal plating layer 340 contacts the cut surface 330 of the second protective layer 330. Here, the surface of the second metal plating layer 340 is formed to be coplanar with the surface of the second protective layer 330. That is, the surfaces of the second metal plating layer 340 and the second protective layer 330 are formed flat along the same straight line. The second metal plating layer 340 configured as above contacts the second line pattern layer 320 and the second protective layer 330.

Figure 4A:
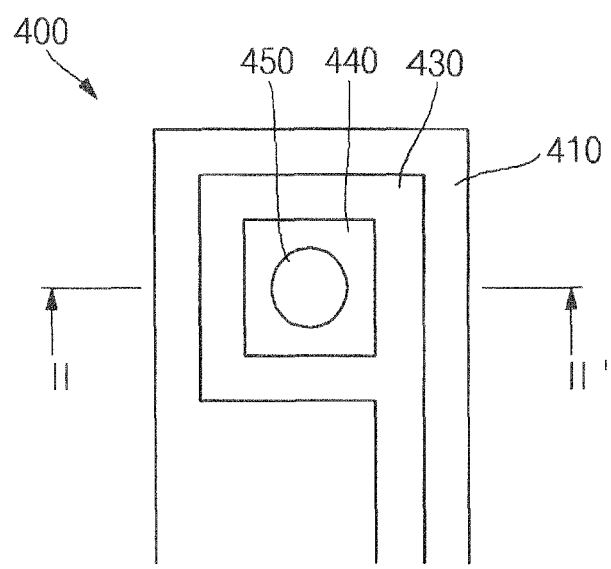
FIGS. 4A and 4B illustrate sectional diagrams of flexible printed circuit boards according to embodiments.
Figure 4B:
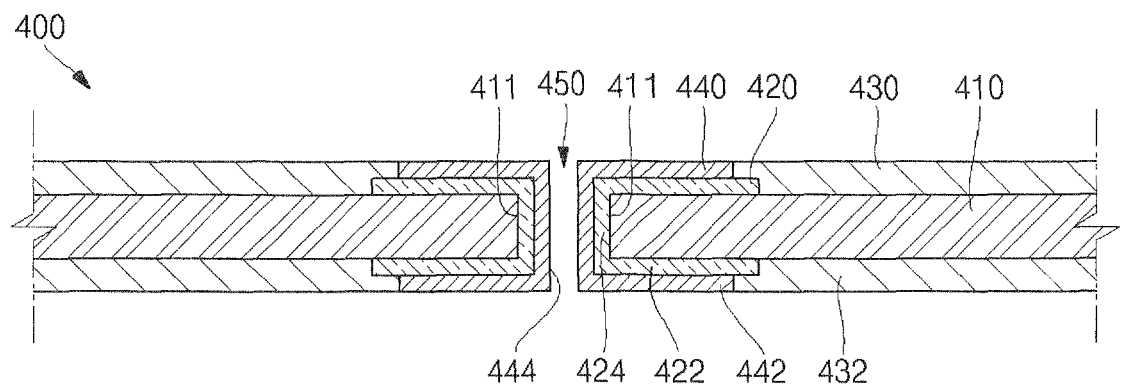

FIGS. 4A and 4B illustrate an enlarged undersurface diagram of a flexible printed circuit board 400 mounted to the top cover 30 in FIG. 1A, and a sectional diagram of the flexible printed circuit board 400 taken along direction II-II'.

Referring to FIGS. 4A and 4B, the flexible printed circuit board 400 may include an insulation layer 410, a first line pattern layer 420, a second line pattern layer 422, a first protective layer 430, a second protective layer 432, a first metal plating layer 440, a second metal plating layer 442, and a hole 450.

Here, the insulation layer 410, the first line pattern layer 420, the second line pattern layer 422, the first protective layer 430, the second protective layer 432, the first metal plating layer 440, and the second metal plating layer 442 have the same structure as illustrated in FIG. 3. Therefore, only differences thereof will be described.

The hole 450 is defined through the insulation layer 410, the first and second line pattern layers 420 and 422, and the first and second metal plating layers 440 and 442. Here, a line pattern connecting region 424 is further formed on the inner wall of the hole 450 along the insulation layer 410. The line pattern connecting region 424 contacts an insulation layer cut surface 411 along the cut surface 411 defined by the hole 450 on the insulation layer 410.

Also, the hole 450 has a metal plating layer connecting region 444 further formed on the sidewall thereof along the line pattern connecting region 424. The metal plating layer connecting region 444 is a region along the line pattern connecting region 424 where the line pattern connecting region 424 contacts the metal plating layers 440 and 442. Therefore, the insulation layer 410, the line pattern connecting region 424, and the metal plating layer connecting region 444 are sequentially formed on the inner wall of the hole 450 from the cut surface 411 of the insulation layer 410.

Figure 5:
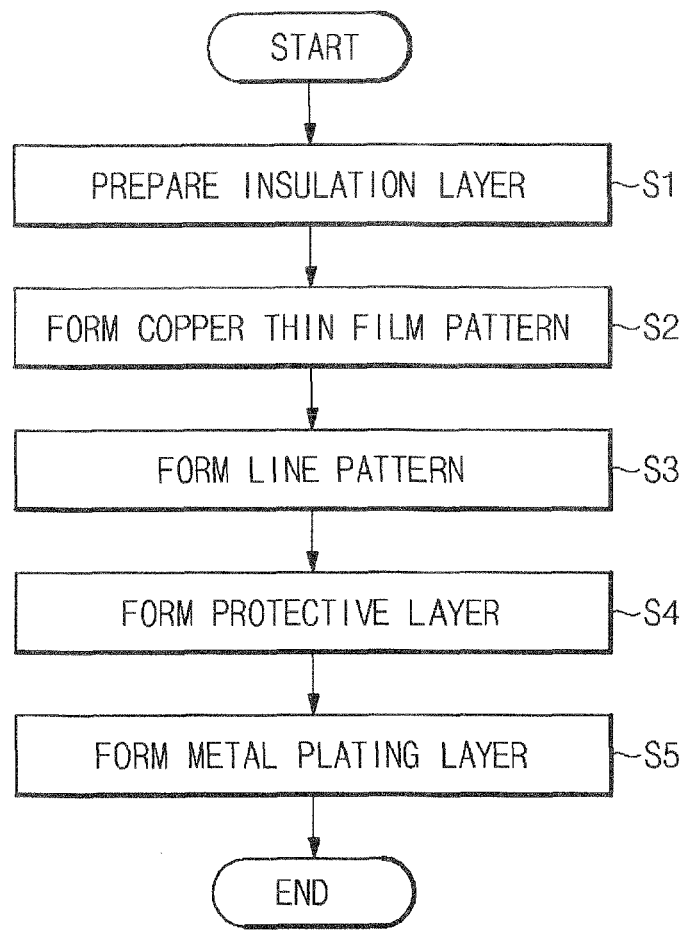
FIG. 5 illustrates a flowchart for a method of making a flexible printed circuit board according to an embodiment.

FIG. 5 illustrates a flowchart for a method of making a flexible printed circuit board according to an embodiment.

Referring to FIG. 5, the method of making a flexible printed circuit board 100 according to an embodiment includes operation S1 of preparing an insulation layer, operation S2 of forming a copper thin film pattern, operation S3 of forming a line pattern, operation S4 of forming a protective layer, and operation S5 of forming a metal plating layer.

FIGS. 6A to 6F are sectional diagrams illustrating a sequence for making a flexible printed circuit board 600 according to an embodiment.

Figure 6A:
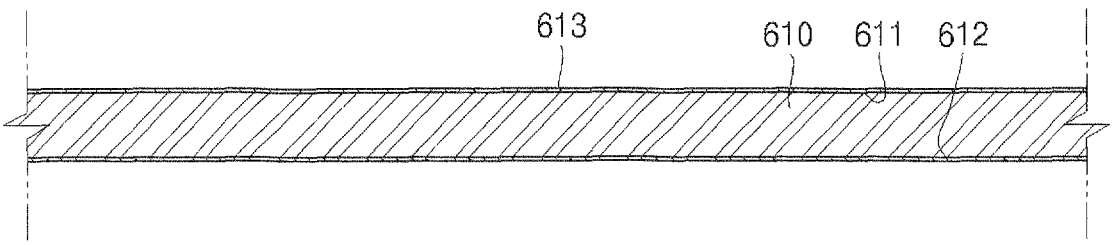
FIGS. 6A to 6F are sectional diagrams illustrating a sequence for making a flexible printed circuit board according to an embodiment.

Referring first to FIG. 6A, an insulation layer is prepared in operation S1.

As illustrated in FIG. 6A, in the preparing of the insulation layer in operation S1, an insulation layer is prepared with a copper thin film 613 formed on a first surface 611 and second surface 612 of the insulation layer 610. The insulation layer 610 is prepared with thin plate-shaped copper thin film 613 formed on the first surface 611 on top of the insulation layer 610 and on the second surface 612 on the bottom of the insulation layer 610. The insulation layer 610 may be formed, for example, of polyester or polyimide film material.

Figure 6B:
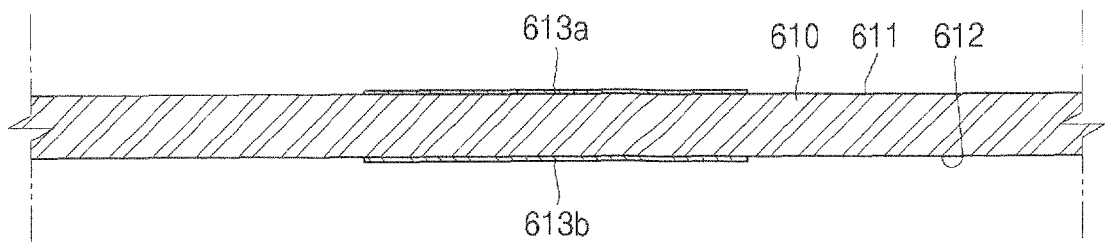

Forming the copper thin film pattern in operation S2 is illustrated in FIG. 6B.

Referring next to FIG. 6B, in the forming of the copper thin film pattern in operation S2, copper thin film patterns 613a and 613b are formed on the first surface 611 and second surface 612 of the insulation layer 610. First, a PR (Photo Resist) is deposited in regions on the copper thin film 613 where the copper thin film patterns 613a and 613b are to be formed. Then, the insulation layer 610 is exposed and etched to form the copper thin film patterns 613a and 613b.

Figure 6C:
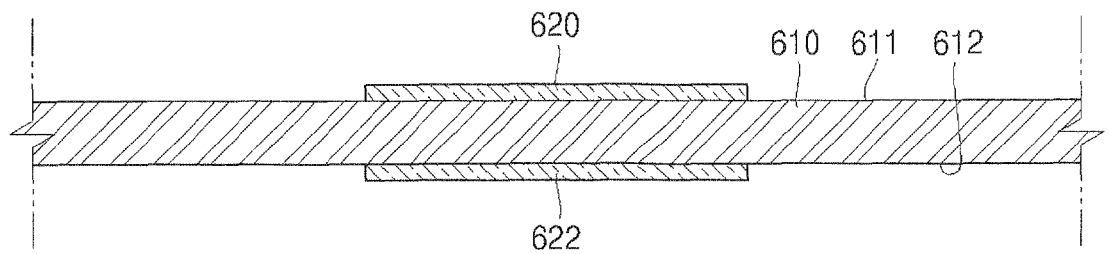

FIG. 6C illustrates the forming of the line pattern in operation S3.

Referring to FIG. 6C, in the forming of the line pattern in operation S3, the copper thin film patterns 613a and 613b are metal plated, and a first line pattern layer 620 and a second line pattern layer 622 are formed. Specifically, the first line pattern layer 620 is formed enclosing the first copper thin film pattern 613a formed on the first surface of the insulation layer 610. Also, the second line pattern layer 622 is formed enclosing the second copper thin film pattern 613b formed on the second surface 612 of the insulation layer 110.

For this end, the top surface and side surface of the copper thin film patterns 613a and 613b are plated through performing electroless plating or electroplating. Here, while the material used for plating may be copper (Cu), titanium (Ti), nickel (Ni), palladium (Pd), etc., in one embodiment, copper is used to form line patterns 620 and 622.

Figure 6D:
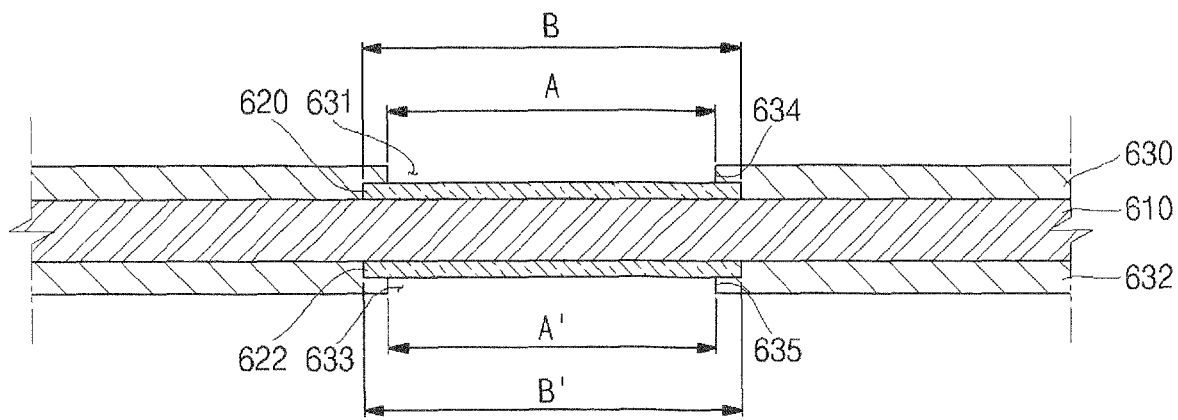

FIG. 6D illustrates forming a protective layer in operation S4.

Referring to FIG. 6D, in the forming of the protective layer in operation S4, a first opening 631 and a second opening 633 are defined in the first line pattern layer 620 and second line pattern layer 622 of the insulation layer 610, to expose portions of the first line pattern layer 620 and the second line pattern layer 622. Specifically, the first protective layer 630 is formed on the first line pattern layer 620 of the insulation layer 610, and the first opening 631 is defined to expose a portion of the first line pattern layer 620. That is, the first protective layer 630 is formed in a certain thickness on the outer perimeter of the first line pattern layer 620 of the insulation layer 610.

Here, the width A of the first opening is made less than the width B of the first line pattern layer 620. Therefore, a cut surface 634 of the first protective layer 630 covers an upper portion of the first line pattern layer 620.

The first protective layer 630 may be one selected from polyimide, epoxy, BCB (Benzo Cyclo Butene), PBO (Poly Benz Oxazole), and equivalents thereof, but is not limited thereto. The first protective layer 630 contacts the upper portion of the insulation layer 610 and a portion of the first line pattern layer 620.

Also, the second protective layer 632 is formed on the insulation layer 610 and the second line pattern layer 622, and defines the second opening 633 to expose a portion of the second line pattern layer 622. Specifically, the second protective layer 630 is formed in a certain thickness at the outer perimeter of the second line pattern layer 622 of the insulation layer 610.

Here, the width A' of the second opening 633 is made less than the width B' of the second line pattern layer 622. Accordingly, the cut surface 635 of the second protective layer 632 covers a lower portion of the second line pattern layer 622.

Figure 6E:
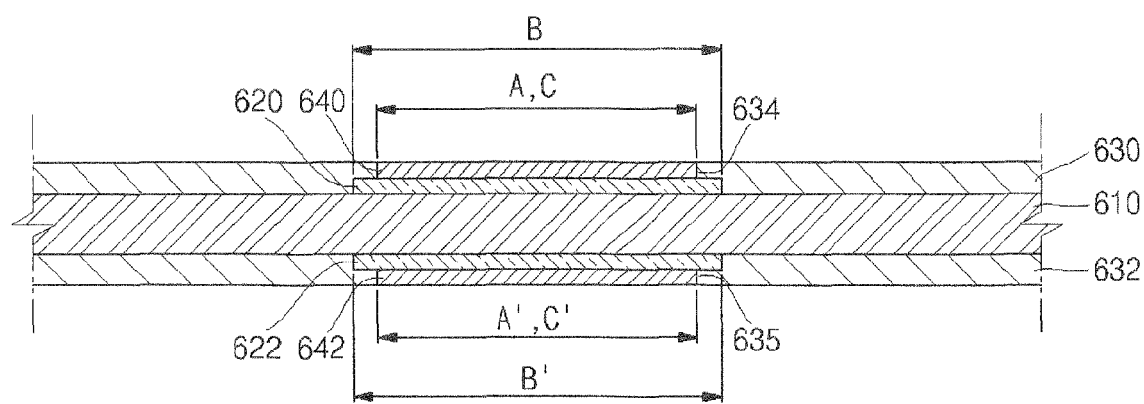
Figure 6F:
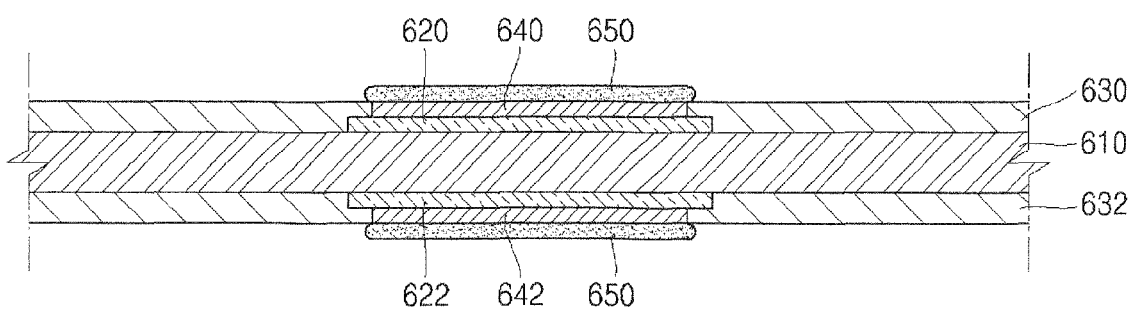

Next, the forming of a metal plating layer in operation S5 is illustrated in FIG. 6E.

Referring to FIG. 6E, in the forming of the metal plating layer in operation S5, the first line pattern layer 620 and the second line pattern layer 622 are plated to form a first and second metal plating layer 640 and 642. Specifically, the first metal plating layer 640 is formed in the first opening 631 of the first protective layer 630. The first metal plating layer 640 is formed on top of the first line pattern layer 620 at a width C equal to the width A of the first opening 631.

Also, the width C of the first metal plating layer 640 is formed less than the width B of the first line pattern layer 620. Accordingly, the cut surface of the first metal plating layer 640 contacts the cut surface 634 of the first protective layer 630. Here, the surface of the first metal plating layer 640 is formed coplanar with the surface of the first protective layer 630. That is, the surfaces of the first metal plating layer 640 and the first protective layer 630 are formed flat along the same straight line. With this configuration, the first metal plating layer 640 contacts the first line pattern layer 620 and the first protective layer 630.

Further, the second metal plating layer 642 is formed in the second opening 633 of the second protective layer 632. The second metal plating layer 642 is formed on the bottom of the second line pattern layer 622 in a width C' equal to the width A' of the second opening 633. Also, the width C' of the second metal plating layer 642 is formed less than the width B' of the second line pattern layer 622. Therefore, the cut surface of the second metal plating layer 642 contacts the cut surface 635 of the second protective layer 632.

Here, the surface of the second metal plating layer 642 is formed coplanar to the surface of the second protective layer 630. That is, the surfaces of the second metal plating layer 642 and the second protective layer 630 are formed flat along a straight line. With this configuration the second metal plating layer 642 contacts the second line pattern layer 622 and the second protective layer 630.

Next, solder 650 is filled in the top of the first metal plating layer 640 and the bottom of the second metal plating layer 642. Accordingly, the battery pack and the flexible printed circuit board 600 may be electrically connected.

Figure 7:
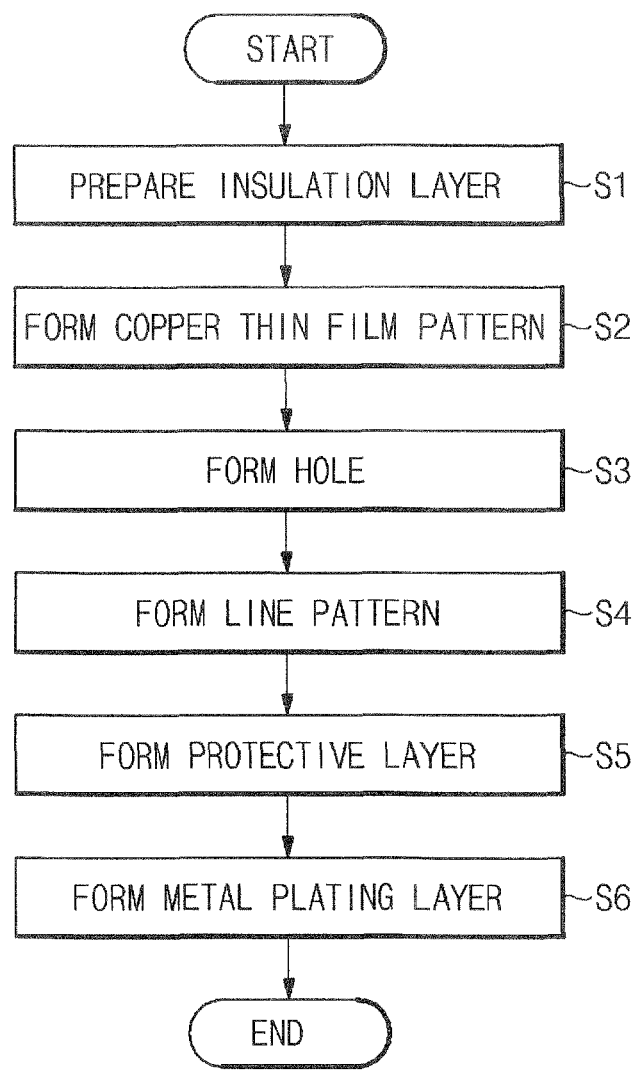
FIG. 7 is a flowchart for a method of making a flexible printed circuit board according to an embodiment.

FIG. 7 is a flowchart for a method of making a flexible printed circuit board according to an embodiment.

Referring to FIG. 7, a method of making a flexible printed circuit board 700 according to an embodiment includes preparing an insulation layer in operation S1, forming a copper thin film pattern in operation S2, forming a hole in operation S3, forming a line pattern in operation S4, forming a protective layer in operation S5, and forming a metal plating layer in operation S6.

FIGS. 8A to 8G are sectional diagrams illustrating a sequence for making a flexible printed circuit board 800 according to an embodiment.

Figure 8A:
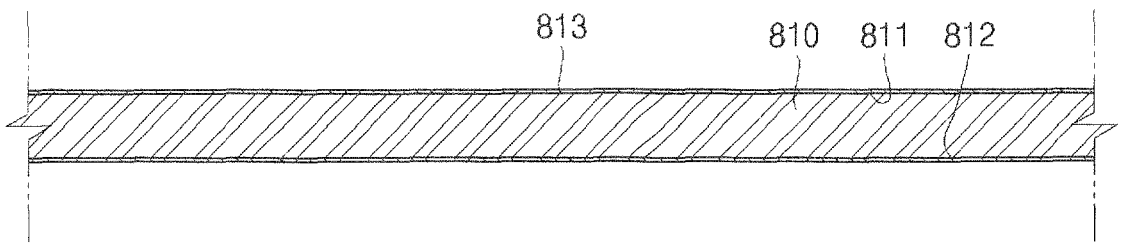
FIGS. 8A to 8G are sectional diagrams illustrating a sequence for making a flexible printed circuit board according to an embodiment.

First, FIG. 8A illustrates preparing an insulation layer in operation S1.

Referring to FIG. 8A, in operation S1 of preparing the insulation layer, an insulation layer 810 is provided with a copper thin film 813 formed on a first surface 811 and second surface 812 thereof. Because operation S1 of preparing the insulation layer is the same as operation S1 of preparing the insulation layer illustrated in FIG. 6A, a description thereof will not be provided.

Figure 8B:
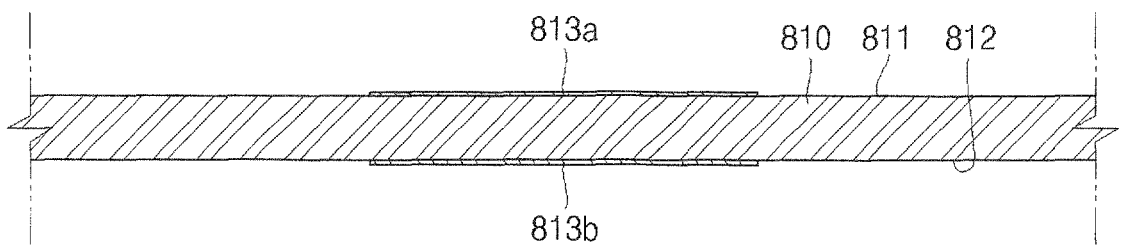

Next, FIG. 8B illustrates forming a copper thin film pattern in operation S2.

Referring to FIG. 8B, in the forming of a copper thin film pattern in operation S2, copper thin film patterns 813a and 813b are formed on the first surface 811 and second surface 812 of the insulation layer 810. The forming of copper thin film pattern in operation S2 is the same as the forming of the copper thin film pattern in operation S2 illustrated in FIG. 6B, and a description thereof will therefore not be provided.

Figure 8C:
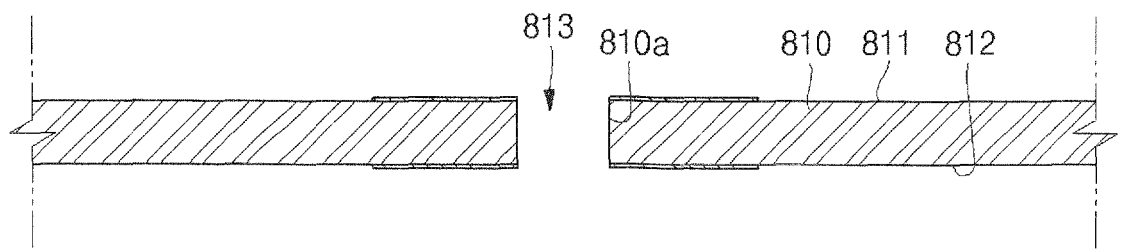

Next, defining a hole in operation S3 is illustrated in FIG. 8C.

Referring to FIG. 8C, in the defining of the hole in operation S3, a hole 813 is defined through the insulation layer 810 and the copper thin film patterns 813a and 813b. The hole 813 is formed in a position through the insulation layer 810 and the copper thin film patterns 813a and 813b at which the hole 813 is to be formed by using a mechanical drill such as a CNC (Computer Numerical Control) Drill. Accordingly, a side surface 810a is formed on the insulation layer 810 around the hole 813 to divide the insulation layer 810 into two regions.

Figure 8D:
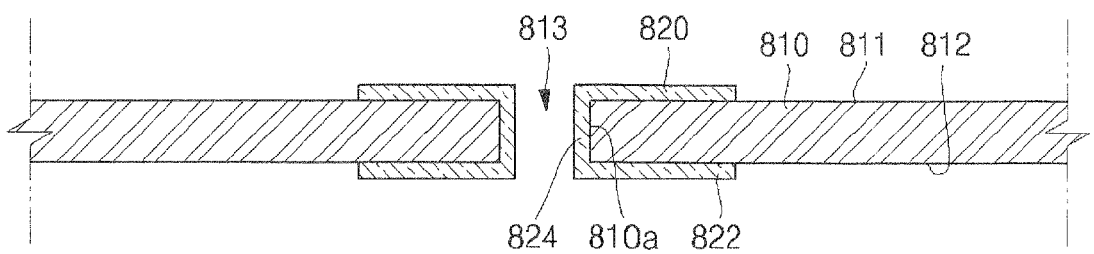

Next, FIG. 8D illustrates forming a line pattern in operation S4.

Referring to FIG. 8D, in forming a line pattern in operation S4, the copper thin film patterns 813a and 813b are plated to form a first line pattern layer 820 and a second line pattern layer 822. Specifically, a first line pattern layer 820 is formed to enclose the first copper thin film pattern formed on the first surface 811 of the insulation layer 810. Also, a second line pattern layer 822 is formed to enclose the second copper thin film pattern formed on the second surface 812 of the insulation layer 810.

Here, a line pattern connecting region 824 is further formed along the side surface 810a of the insulation layer 810 at the inner wall of the hole 813 defined in the insulation layer 810. The line pattern connecting region 824 contacts the side surface 810a of the insulation layer 810.

The line pattern layers 820 and 822 plate the top and side surfaces of the first and second copper thin film patterns 813a and 813b through electroless or electroplating. Here, the plating material used may be copper (Cu), titanium (Ti), nickel (Ni), palladium (Pd), etc., and copper is used to form the line pattern layers 820 and 822 in this embodiment.

Figure 8E:
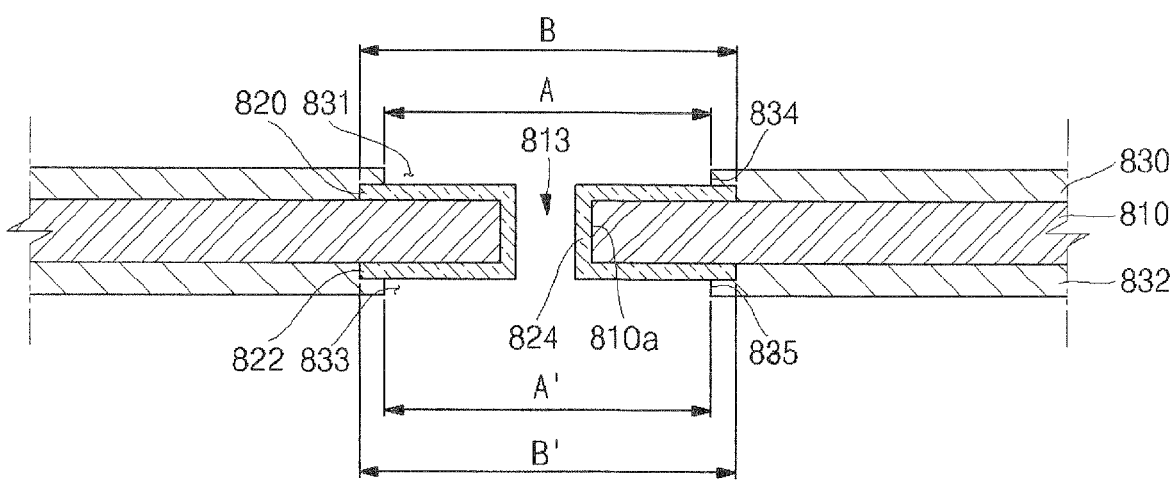

Next, FIG. 8E illustrates forming a protective layer in operation S5.

Referring to FIG. 8E, in forming the protective layer in operation S5, first and second protective layers 830 and 832 are formed that define a first opening 831 and a second opening 833 that expose portions of the insulation layer 810, first line pattern layer 820, and second line pattern layer 822. Specifically, the first protective layer 830 defines a first opening 831 in the insulation layer 810 and the first line pattern layer 820, to expose a portion of the first line pattern layer 820. Here, the width A of the first opening 831 is made less than the width B of the first line pattern layer 820. Accordingly, a cut surface 834 of the first protective layer 830 covers a top portion of the first line pattern layer 820.

Also, the second protective layer 832 defines a second opening 833 in the insulation layer 810 and the second line pattern layer 822, to expose a portion of the second line pattern layer 822. Here, the width A' of the second opening 833 is made less than the width B' of the second line pattern layer 822. Accordingly, a cut surface 835 of the second protective layer 832 covers a bottom portion of the second line pattern layer 822.

Figure 8F:
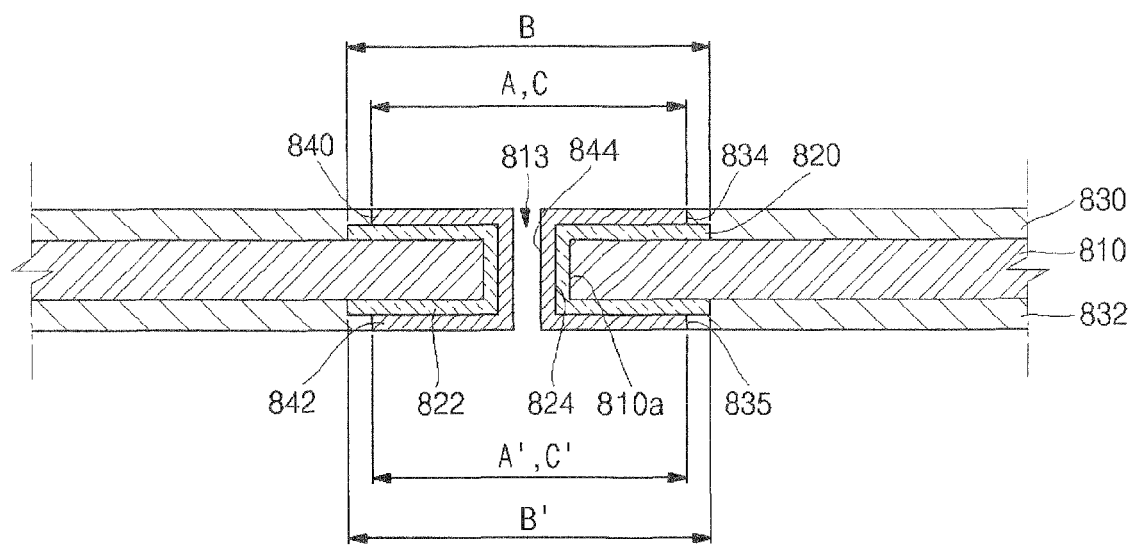

Next, FIG. 8F illustrates the forming of a metal plating layer in operation S6.

Referring to FIG. 8F, in the forming of the metal plating layer in operation S6, the first line pattern layer 820 and the second line pattern layer 822 are plated to form a first and second metal plating layer 840 and 842. Specifically, the first metal plating layer 840 is formed in the first opening 831 of the first protective layer 830. The first metal plating layer 840 is formed on top of the first line pattern layer 820 with a width C that is the same as the width A of the first opening 831. Also, the width C of the first metal plating layer 840 is made less than the width B of the first line pattern layer 820. Accordingly, the cut surface of the first metal plating layer 840 contacts the cut surface 834 of the first protective layer 830.

Here, the surface of the first metal plating layer 840 is formed coplanar to the surface of the first protective layer 830. That is, the surfaces of the first metal plating layer 840 and first protective layer 830 are formed flat along a straight line. In such a configuration, the first metal plating layer 840 contacts the first line pattern layer 820 and the first protective layer 830.

In addition, the second metal plating layer 842 is formed in the second opening 833 of the second protective layer 832. The second metal plating layer 842 is formed at the bottom of the second line pattern layer 822 in a width C' that is the same as the width A' of the second opening 833. Also, the width C' of the second metal plating layer 842 is made less than the width B' of the second line pattern layer 822. Accordingly, a cut surface of the second metal plating layer 842 contacts the cut surface 835 of the second protective layer 832.

Here, the surface of the second metal plating layer 842 is formed coplanar with the surface of the second protective layer 832. That is, the surfaces of the second metal plating layer 842 and the second protective layer 832 are formed flat along a straight line. As such, the second metal plating layer 842 contacts the second line pattern layer 822 and the second protective layer 832.

Here, a metal plating layer connecting region 844 is further formed along the line pattern connecting region 824 on the inner wall of the hole 813. The metal layer connecting region 844 is a portion where the line pattern connecting region 824 and the metal plating layers 840 and 842 contact along the sidewall of the line pattern connecting region 824. That is, the insulation layer 810, the line pattern connecting region 824, and the metal plating layer connecting region 844 are formed in sequence on the inner wall of the hole 813 from the cut surface 810a of the insulation layer 810.

Figure 8G:
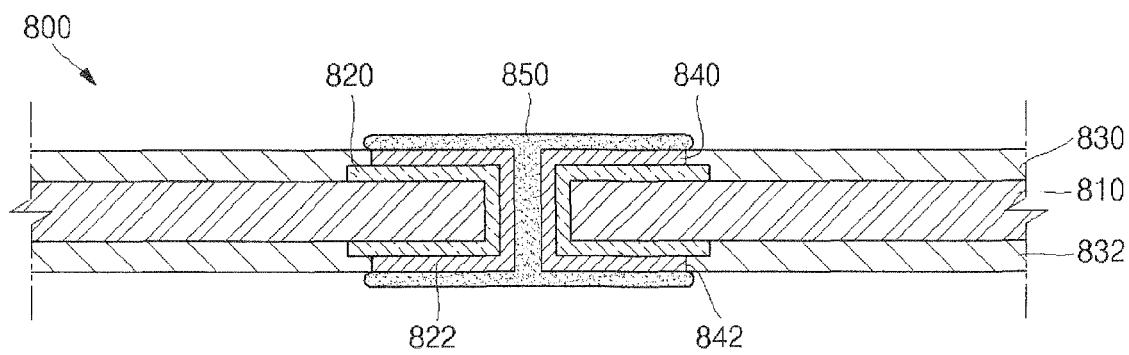

Next, FIG. 8G illustrates filling solder 850 in the hole 813.

That is, the solder 850 is filled in the top and bottom of the first and second metal plating layers 840 and 842 and the hole 813.

Here, the solder 850 may be formed in a bulging shape at the top of the first metal plating layer 840, and may be filled up to the surface of the first line pattern 820. Also, the solder 850 may be formed in a bulging shape at the bottom of the second metal plating layer 842, and may be filled up to the surface of the second line pattern 822. The flexible printed circuit board 800 may be electrically connected to a battery pack through the solder 850.

As described above, with a secondary battery and method of making the secondary battery according to embodiments, by improving the structure of a metal plating layer and protective layer, separation of the metal plating layer and a flexible printed circuit board can be prevented to ensure reliability of the flexible printed circuit board.

Also, a flexible printed circuit board as described above according to embodiments has a hole defined therein, and solder is filled in the hole to electrically connect with a battery pack, so that adhering force between the battery pack and the flexible printed circuit board can be increased.

Exemplary embodiments of a secondary battery and method for making the secondary battery have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A secondary battery, comprising:
   a bare cell; and
   a flexible printed circuit a flexible printed circuit board electrically connected to the bare cell, the flexible printed circuit board comprising:
   an insulation layer providing a first surface and a second surface;
   a first line pattern layer formed on the first surface of the insulation layer;
   a first protective layer formed on the insulation layer and the first line pattern layer, and defining a first opening that exposes a portion of the first line pattern layer; and
   a first metal plating layer formed in the first opening,
   wherein the first protective layer contacts both a side surface of the first line pattern layer and a side surface of the first metal plating layer,
   wherein the first metal plating layer has a top surface that is coplanar to a top surface of the first protective layer.

2. The secondary battery as claimed in claim 1, wherein the first opening has a width that is less than a width of the first line pattern layer.

3. The secondary battery as claimed in claim 1, wherein the first metal plating layer has a width that is the same as a width of the first opening.

4. The secondary battery as claimed in claim 1, further comprising a second protective layer formed on the second surface of the insulation layer.

5. The secondary battery as claimed in claim 1, further comprising:
   a second line pattern layer formed on the second surface of the insulation layer; and
   a second protective layer defining a second opening that exposes a portion of the second line pattern layer.

6. The secondary battery as claimed in claim 5, wherein the second opening has a second metal plating layer formed therein.

7. The secondary battery as claimed in claim 6, wherein the second metal plating layer has a top surface that is coplanar to a top surface of the second protective layer.

8. A secondary battery, comprising:
   an insulation layer providing a first surface and a second surface;
   a first and a second line pattern layer formed on the first and second surfaces, respectively, of the insulation layer;
   a first protective layer formed on the insulation layer and the first line pattern layer, and defining a first opening that exposes a portion of the first line pattern layer;

a second protective layer formed on the insulation layer and the second line pattern layer, and defining a second opening that exposes a portion of the second line pattern layer;

a first metal plating layer and a second metal plating layer formed in the first opening and the second opening, respectively; and a hole defined through the insulation layer, the first and second line pattern layers, and the first and second metal plating layers, wherein the first protective layer contacts both a side surface of the first metal plating layer and a side surface of the first line pattern layer, and the second protective layer contacts both a side surface of the second metal plating layer and a side surface of the second line pattern layer, wherein the first metal plating layer has a top surface that is coplanar to a top surface of the first protective layer and the second metal plating layer has a top surface that is coplanar to a top surface of the second protective layer.

9. The secondary battery as claimed in claim 8, wherein the first opening and the second opening have widths that are less than widths of the first line pattern layer and the second line pattern layer, respectively.

10. The secondary battery as claimed in claim 8, wherein the first metal plating layer and the second metal plating layer have widths that are equal to widths of the first opening and the second opening, respectively.

11. The secondary battery as claimed in claim 8, further comprising a line pattern connecting region formed on an inner wall of the hole along the insulation layer.

12. The secondary battery as claimed in claim 8, further comprising a metal plating layer connecting region formed on an inner wall of the hole along a line pattern connecting region.

13. A method of making a secondary battery, the method comprising the steps of:

preparing an insulation layer with a copper thin film formed on a first surface and a second surface thereof;

forming a copper thin film pattern on the first and second surfaces of the insulation layer;

forming a first line pattern layer and a second line pattern layer through metal plating the copper thin film pattern;

defining a first opening and a second opening in the insulation layer and in the first line pattern layer and the second line pattern layer, respectively, to expose a portion of the first line pattern layer and the second line pattern layer, respectively;

forming a first protective layer on the first surface of the insulation layer;

forming a second protective layer on the second surface of the insulation layer;

forming a first and second metal plating layer through metal plating the first line pattern layer and the second line pattern layer; and contacting the first protective layer with both a side surface of the first metal plating layer and a side surface of the first line pattern layer, and contacting the second protective layer with both a side surface of the second metal plating layer and a side surface of the second line pattern layer wherein the first metal plating layer has a top surface that is coplanar to a top surface of the first protective layer and the second metal plating layer has a top surface that is coplanar to a top surface of the second protective layer.

14. The method as claimed in claim 13, wherein in the forming of the line pattern layers, widths of the first and second line pattern layers are made greater than widths of the first and second openings, respectively.

15. The method as claimed in claim 13, wherein in the forming of the metal plating layers, widths of the first and second metal plating layers are made the same as widths of the first and second openings, respectively.

16. A method of making a secondary battery, the method comprising the steps of:

preparing an insulation layer with a copper thin film formed on a first surface and a second surface thereof;

forming a first and second copper thin film pattern on the first and second surfaces, respectively, of the insulation layer;

defining a hole through the insulation layer and the copper thin film patterns;

forming a first line pattern layer and a second line pattern layer through metal plating the copper thin film patterns;

defining a first opening and a second opening in the insulation layer and in the first line pattern layer and the second line pattern layer, respectively, to expose a portion of the first line pattern layer and the second line pattern layer, respectively;

forming a first protective layer on the first surface of the insulation layer;

forming a second protective layer on the second surface of the insulation layer;

forming a first and second metal plating layer through metal plating the first line pattern layer and the second line pattern layer; and contacting the first protective layer with both a side surface of the first metal plating layer and a side surface of the first line pattern layer, and contacting the second protective layer with both a side surface of the second metal plating layer and a side surface of the second line pattern layer, wherein the first metal plating layer has a top surface that is coplanar to a top surface of the first protective layer and the second metal plating layer has a top surface that is coplanar to a top surface of the second protective layer.

17. The method as claimed in claim 16, wherein the forming of the line pattern layers includes forming a line pattern connecting region along an inner wall of the hole.

18. The method as claimed in claim 16, wherein the metal plating of the line pattern layers includes forming a metal plating layer connecting region along a line pattern connecting region.

* * * * *